United States Patent
Hyde et al.

(10) Patent No.: US 6,664,909 B1
(45) Date of Patent: Dec. 16, 2003

(54) METHOD AND APPARATUS FOR TRIMMING HIGH-RESOLUTION DIGITAL-TO-ANALOG CONVERTER

(75) Inventors: John D. Hyde, Corvalis, OR (US); Miguel E. Figueroa, Seattle, WA (US); Todd E. Humes, Shoreline, WA (US); Christopher J. Diorio, Shoreline, WA (US); Terry D. Hass, Ballwin, MO (US); Chad A. Lindhorst, Seattle, WA (US)

(73) Assignee: Impinj, Inc., Seattle, WA (US)

( * ) Notice: Subject to any disclaimer, the term of this patent is extended or adjusted under 35 U.S.C. 154(b) by 0 days.

(21) Appl. No.: 09/929,652

(22) Filed: Aug. 13, 2001

(51) Int. Cl.[7] ............................................. H03M 1/66
(52) U.S. Cl. ..................... 341/144; 341/133; 341/136; 341/121
(58) Field of Search ................................ 341/118, 120, 341/121, 135, 136, 144, 133

(56) References Cited

U.S. PATENT DOCUMENTS

| | | | |
|---|---|---|---|
| 4,864,215 A | * 9/1989 | Schouwenaars et al. | 323/312 |
| 5,243,347 A | * 9/1993 | Jackson et al. | 341/144 |
| 5,332,997 A | * 7/1994 | Dingwall et al. | 341/150 |
| 5,376,935 A | * 12/1994 | Seligson | 341/136 |
| 5,666,118 A | * 9/1997 | Gersbach | 341/120 |
| 5,790,060 A | * 8/1998 | Tesch | 341/119 |
| 5,825,063 A | * 10/1998 | Diorio et al. | 257/321 |
| 5,825,317 A | * 10/1998 | Anderson et al. | 341/118 |
| 5,841,384 A | 11/1998 | Herman et al. | 341/138 |
| 5,870,044 A | 2/1999 | Dell'ova et al. | 341/120 |
| 5,952,946 A | * 9/1999 | Kramer et al. | 341/136 |
| 5,955,980 A | * 9/1999 | Hanna | 341/120 |
| 6,118,398 A | * 9/2000 | Fisher et al. | 341/144 |
| 6,130,632 A | * 10/2000 | Opris | 341/120 |
| 6,169,503 B1 | * 1/2001 | Wong | 341/136 |
| 6,191,715 B1 | 2/2001 | Fowers | 341/120 |
| 6,317,066 B1 | * 11/2001 | Chiang | 341/144 |
| 2002/0089440 A1 | * 7/2002 | Kranz et al. | 341/143 |

OTHER PUBLICATIONS

Vittoz, "Dynamic Analog Techniques", Design of Analog–Digital VLSI Circuits for Telecommunications and Signal Processing, Chapter 4, 1994, pp. 97–124.

Vittoz, "Continuous–Time Filters", Design of Analog–Digital VLSI Circutis for Telecommunications and Signal Processing, Chapter 6, 1994, pp. 177–211.

Vittoz, "Analog–Digital Conversion Techniques for Telecommunications Applications", Design of Analog–Digital VLSI Circuits for Telecommunications and Signal Processing, Chapter 9, 1994, pp. 289–315.

Vittoz, "Delta–Sigma Data Converters", Design of Analog–Digital VLSI Circuits for Telecommunications and Signal Processing, Chapter 10, 1994, pp. 317–339.

(List continued on next page.)

*Primary Examiner*—Michael Tokar
*Assistant Examiner*—Khai Nguyen
(74) *Attorney, Agent, or Firm*—Thelen Reid & Priest LLP; David B. Ritchie

(57) ABSTRACT

A method and apparatus for trimming a high-resolution digital-to-analog converter (DAC) utilizes floating-gate synapse transistors to trim the current sources in the DAC by providing a trimmable current source. Fowler-Nordheim electron tunneling and hot electron injection are the mechanisms used to vary the amount of charge on the floating gate. Since floating gate devices store charge essentially indefinitely, no continuous trimming mechanism is required, although one could be implemented if desired. By trimming the current sources with high accuracy, a DAC can be built with a much higher resolution and with smaller size than that provided by intrinsic device matching.

36 Claims, 9 Drawing Sheets

OTHER PUBLICATIONS

Jose Bastos et al., entitled, "A 12–Bit Intrinsic Accuracy High–Speed CMOS DAC", Dec. 1998, IEEE Journal of Solid–State Circuits, vol. 33, No. 12, pp. 1959–1969.

Geert A. M. Van der Plas et al., entitled, "A 14–bit Intrinsic Accuracy $Q^2$ *Random Walk* CMOS DAC", Dec. 1999, IEEE Journal of Solid–State Circuits, vol. 34, No. 12, pp. 1708–1718.

Alex R. Bugeja et al., entitled, "A 14–b, 100–MS/s CMOS DAC Designed for Spectral Performance", Dec. 1999, IEEE Journal of Solid–State Circuits, vol. 34, No. 12, pp. 1719–1732.

Alex R. Bugeja et al., entitled, "A Self–Trimming 14–b 100–MS/s CMOS DAC", Dec. 2000, IEEE Journal of Solid–State Circuits, vol. 35, No. 12, pp. 1841–1852.

* cited by examiner

Erase all trim current sources /⁻⁷⁰
For $i := L$ to $L + M - 1$  ⟶₇₂
Begin
    Apply codeword $2^i-1+LSB$
    target := DAC output
    Apply codeword $2^i$
    If output greater than target
        Inject on global current regulator and start again
    While output less than target
        Inject on trim current source $i$
End For $j := 1$ to $2^N-1$  /⁻⁷⁴
Begin
    Apply codeword $2^{L+M}-1 + LSB + (j-1)*2^{L+M}$
    target := DAC output
    Apply codeword $j*2^{L+M}$
    If output greater than target
        Inject on global current regulator and start again
    While output less than target
        Inject on trim current source $L + M + (j-1)$
End

*FIG. 5*

METHOD AND APPARATUS FOR TRIMMING HIGH-RESOLUTION DIGITAL-TO-ANALOG CONVERTER

FIELD OF THE INVENTION

The present invention is directed to the field of digital-to-analog conversion. More particularly, the present invention is directed to a method and apparatus for trimming a digital-to-analog converter (DAC) with nonvolatile trimmable current sources to provide a high-resolution current-steering-type DAC.

BACKGROUND OF THE INVENTION

Digital-to-analog converters are well known in the art. These devices take a digital input word and output an analog value corresponding to the magnitude of the digital input word. The current-steering-type of DAC provides its analog output as a current value. Thus, as typically configured, a small magnitude digital input word results in a small output current and a large magnitude digital input word results in a correspondingly large output current. Current steering DACs are useful in a plethora of applications, particularly any type of application where digital control is used and an analog output is required. For example, emerging standards for communications systems require DACs with sample rates in the hundreds of millions of samples per second and resolutions of 10–14 bits or more. The sample rate is simply the number of times per unit time period that the DAC looks at a new input and generates a new output. The resolution refers to the size in bits of the digital input word. A one-bit resolution would correspond to only two possible output states. A 14-bit resolution corresponds to $2^{14}$ (16384) output states. Additional constraints are imposed by the desire to fabricate such devices in conventional CMOS (complementary metal oxide semiconductor) processes without the need for additional masks, process steps, components or materials. At its most basic level, a "standard CMOS" process only requires that the process provide nMOS (n-channel MOSFETs) and pMOS (p-channel MOSFETs) transistors and conductive interconnect between and among them.

Some of the goals in fabricating such devices include low power dissipation, small die area, and compatibility with standard CMOS processing so that both digital and analog circuitry can exist on the same chip without modifying the fabrication process. Since it is desirable to be able to integrate such devices as part of system on a chip (SOC) integrated products, the latter goal is particularly important.

Current steering DACs are attractive for these applications because they are fast and can drive an output load without a voltage buffer. Their linearity, however, is limited by mismatch in the current-source transistors. This means that individual current-source transistors are difficult to fabricate so that they provide identical or perfectly scaled performance. Inherent imprecision in the fabrication process means that the performance of two near-identical transistors will only be able to be somewhat similar. To reduce the impact of this mismatch phenomenon, some mechanism is needed to match or average the performance of the current-source transistors so that they behave nearly ideally. In the past, designers have used several different mechanisms to achieve these goals. For example, laser-trimmable components, such as cermet or nichirome resistors, have been used to attempt to match the performance of transistors to an ideal. Large transistors have also been used to try to minimize mismatch. These approaches are undesirable because they increase the die area used by the DAC. Moreover, trimmable resistor components are undesirable because they take relatively large amounts of die area and require special processing steps not compatible with SOC integration. Randomized layouts have also been used as have architectures where plural transistors are used for each current steering element in order to average out performance differences among nearly identical transistors. Such intrinsic matching approaches generally require complicated layout techniques that usually result in a substantial adverse impact on die size and chip yield. Electrical trimming with on-chip capacitors has been used but requires continuous calibration of the current sources in the DAC because the calibration information held in the capacitors is continuously degrading due to leakage currents. Continuous calibration approaches are undesirable in general because they suffer from the effects of switching noise and require complicated circuitry to adjust current sources on the fly without impacting the performance of the DAC. Accordingly, it would be desirable to have an approach to transistor matching that combines the flexibility of electrical trimming with the dynamic stability of intrinsic matching.

BRIEF DESCRIPTION OF THE INVENTION

A method and apparatus for trimming a high-resolution digital-to-analog converter (DAC) utilizes floating-gate synapse transistors to trim the current sources in the DAC by providing a trimmable current source. Fowler-Nordheim electron tunneling and hot electron injection are the mechanisms used to vary the amount of charge on the floating gate. Since floating gate devices store charge essentially indefinitely, no continuous trimming mechanism is required, although one could be implemented if desired. By trimming the current sources with high accuracy, a DAC can be built with a much higher resolution and with smaller size than that provided by intrinsic device matching.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention.

In the drawings:

FIG. 5 is a pseudo-code listing of a process for trimming the trimmable current sources of a DAC in accordance with one embodiment of the present invention.

DETAILED DESCRIPTION

Embodiments of the present invention are described herein in the context of a method and apparatus for trimming a high-resolution digital-to-analog converter. Those of ordinary skill in the art will realize that the following detailed description of the present invention is illustrative only and is not intended to be in any way limiting. Other embodiments of the present invention will readily suggest themselves to such skilled persons having the benefit of this disclosure. For example, other types of current sources could also be trimmed by the basic mechanisms disclosed herein. Reference will now be made in detail to implementations of the present invention as illustratedin the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Synapse Transistors

Synapse transistors are conventional transistors with the following additional attributes: (1) nonvolatile analog weight storage, (2) locally computed bidirectional weight updates, and (3) simultaneous memory.reading and writing. Synapse transistors are described, for example, in U.S. Pat. Nos. 5,627,392, 5,825,063 and 5,898,613 to Diorio et al. Floating-gate MOSFETs are used as the basis for synapse transistors in accordance with one embodiment of the present invention. Synapse transistors use charge stored on a floating gate charge to represent the nonvolatile analog weight, electron tunneling and hot-electron injection to modify the floating-gate charge bidirectionally, and allow simultaneous memory reading and writing by nature of the mechanisms used to write the memory. The pFET synapse transistor is discussed in detail herein because of its inherent compatibility with standard CMOS processing. Other types of synapse transistors could also be used as will now be appreciated by those of ordinary skill in the art but the pFET synapse transistor is most compatible with standard CMOS processing.

Figure 1:
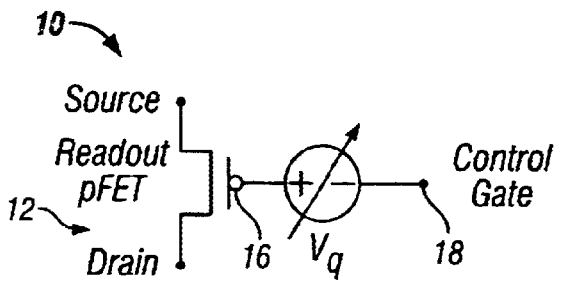
FIG. 1 is a conceptual circuit model of a pFET synapse transistor in accordance with one embodiment of the present invention.
Figure 2A:
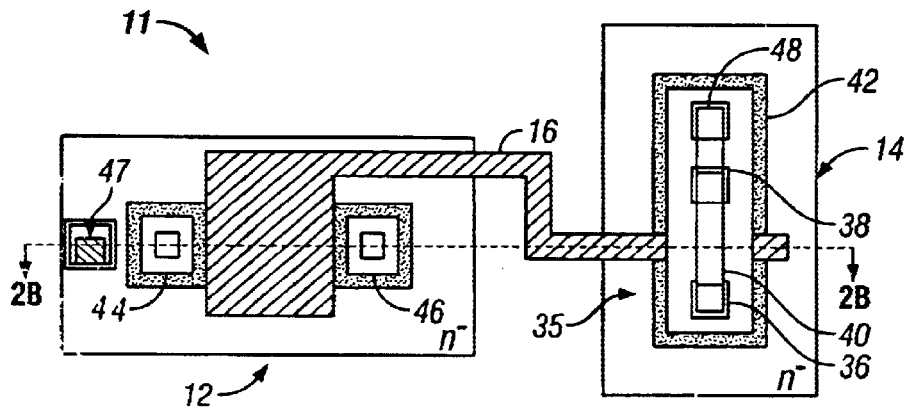
FIG. 2A is a layout view of a pFET synapse transistor device in accordance with one embodiment of the present invention.
Figure 2B:
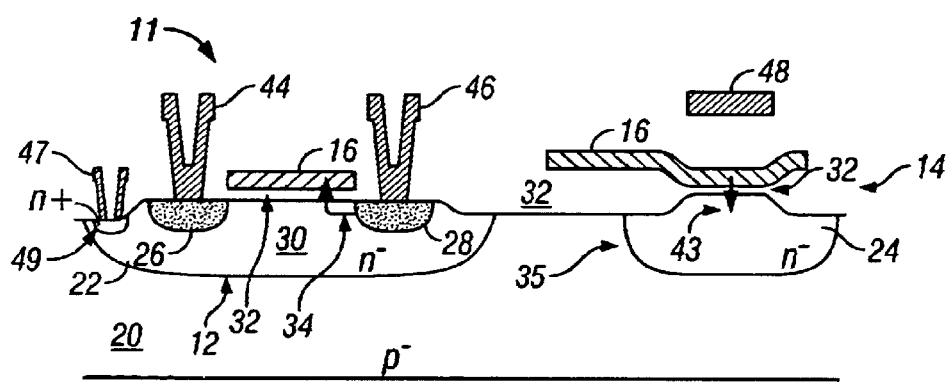
FIG. 2B is a vertical cross-sectional view of a pFET synapse transistor device taken along line 2B—2B of FIG. 2A.
Figure 2C:
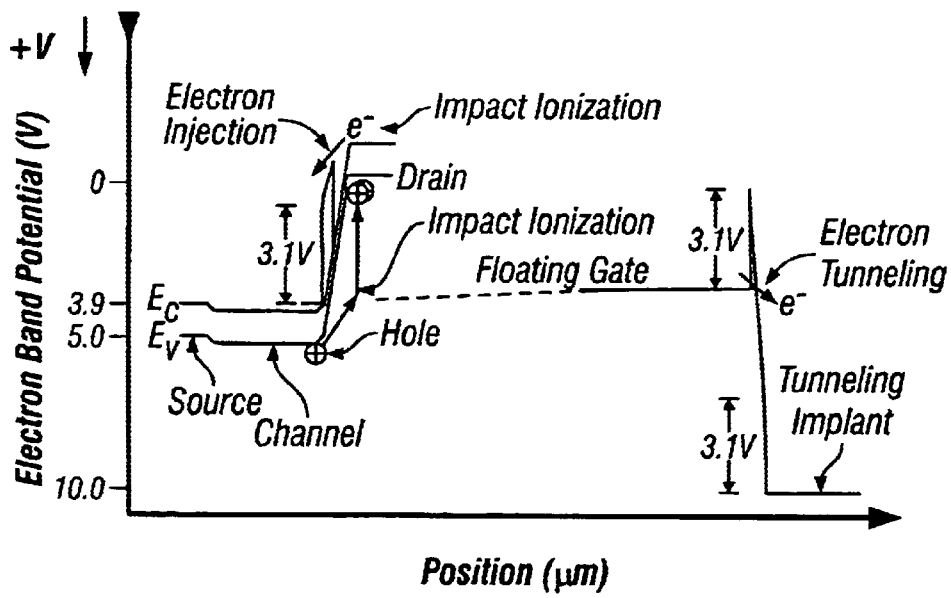
FIG. 2C is a band diagram of a pFET synapse transistor device in accordance with FIG. 2A.

A conceptual circuit model 10 for a pFET synapse transistor 11 is illustrated in FIG. 1. Electron tunneling and injection modify the gate offset voltage $V_q$. A layout view of the synapse transistor is illustrated in FIG. 2A. A cross-sectional view taken along line 2B—2B of the synapse transistor 11 of FIG. 2A is illustrated in FIG. 2B and the band diagram for the synapse transistor 11 is illustrated in FIG. 2C. The synapse transistor 11 comprises two MOSFETs: the first is a readout transistor 12; the second, with shorted drain and source, forms a tunneling junction 14. The floating gate 16 is disposed over both readout transistor 12 and tunneling junction 14. Removing electrons from or adding electrons to the floating gate 16 shifts the readout pFET's threshold voltage bidirectionally. The synapse transistor 11 primarily uses Fowler-Nordheim (FN) tunneling to remove electrons from its floating gate 16, and impact-ionized hot-electron injection (IHEI) to add electrons to the floating gate 16. For a discussion of IHEI, see, e.g., C. Diorio, P. Hasler, B. A. Minch and C. Mead, "A floating-gate MOS learning array with locally computed weight updates", IEEE Trans. Electron Devices, vol. 44, no. 12, pp. 2281–2289, 1997. Because the synapse transistors used in this application are used as current sources, there is no need for a gate input, accordingly, the version of the synapse transistor shown in FIGS. 2A, 2B and 2C lacks a control gate and hence obviates the need for a second layer of highly-doped polycrystalline silicon (poly2) ensuring compatibility with standard digital CMOS processing.

Turning now in detail to FIGS. 2A and 2B, the pFET synapse transistor 11 is formed in a p– doped substrate 20 (doping level on the order of $10^{17}$ atoms/cc) although those of ordinary skill in the art will now realize that it could as easily be formed as a thin film transistor (TFT) above the substrate, or on an insulator (SOI) or on glass (SOG). Essentially, any process capable of forming pFETs and nFETs will work. In substrate 20 are formed a first n– doped well 22 (doping level on the order of $10^{17}$ atoms/cc) and a second n– doped well 24 (doping level on the order of $10^{17}$ atoms/cc). In first n– well 22 are formed a pair of p+ doped regions 26, 28 which may be; diffusions or implants (doping level on the order of $10^{21}$ atoms/cc) which form, respectively, the source 26 and drain 28 of readout transistor 12. A channel 30 is formed between source 26 and drain 28. Over channel 30 is disposed a high quality gate oxide (typically $SiO_2$) 32 of a thickness commensurate with the voltages to be used in the application. In accordance with one embodiment of the present invention, the gate oxide 32 has a thickness in a range of about 70 angstroms to about 110 angstroms in the region above the channel 30. Over gate oxide layer 32 above channel 30 is disposed floating gate 16. When drain 28 has a sufficiently negative voltage relative to source 26, positively charged holes will be accelerated in channel 30 toward drain 28 and will impact with the crystalline lattice in the region of drain 28 creating an electron-hole pair. The electron is then repelled by the relatively negative drain are thereby injected (34) across the gate oxide layer 32 onto floating gate 16. In second n– doped well 24 is formed a "shorted" pFET 35, i.e., a pFET with its drain 36 and source 38 preferably shorted together with a metal or heavily-doped polycrystalline silicon conductor 40. It is possible to forego the shorting conductor 40 because when floating gate 16 has sufficient charge (i.e., positive charge) stored on it and the source 38 of pFET 35 is held at a relatively positive voltage, pFET 35 will conduct and effectively be "shorted". In one embodiment, conductor 40 overlies floating gate 16 in the region of tunneling junction 14 as shown. An n+ region 42 (doping level on the order of $10^{21}$ atoms/cc) is formed in n− well 24 and is also preferably (but not necessarily) shorted to drain 36 and source 38 by conductor 40. Tunneling occurs between floating gate 16 and n− well 24 in region 43 as shown when a sufficiently positive voltage is applied to n− well 24 via n+ region 42. A source contact terminal 44, a drain contact terminal 46 and an n+ region contact terminal 48 are provided. A well contact terminal 47 coupled to an n+ region 49 (doping level on the order of $10^{21}$ atoms/cc) in n− well 22 may also be provided. It should generally be tied to a source of positive potential. It may be strapped to the source 26.

The tunneling junction 14 comprises a shorted pFET in an n− well for two primary reasons. First, a lightly-doped n− well can accommodate relatively high positive voltage without pn-junction breakdown to the substrate. Second, a shorted pFET in an n− well is a valid structure (that is, it satisfies the design rules) in any CMOS process.

Key features of the synapse transistor 11 illustrated at FIGS. 2A, 2B and 2C are (a) the readout transistor 12 remains a fully functional p-channel MOSFET; (b) relatively high voltages applied to the tunneling junction 14 tunnel electrons off the floating gate 16; (c) relatively large drain-to-source (26 to 28) voltages cause IHEI at the drain 28, injecting electrons onto the floating gate 16. Those of ordinary skill in the art will now realize that other mechanisms for injecting charge onto the floating gate may also be used, including tunneling.

DAC Implementation

Figure 3:
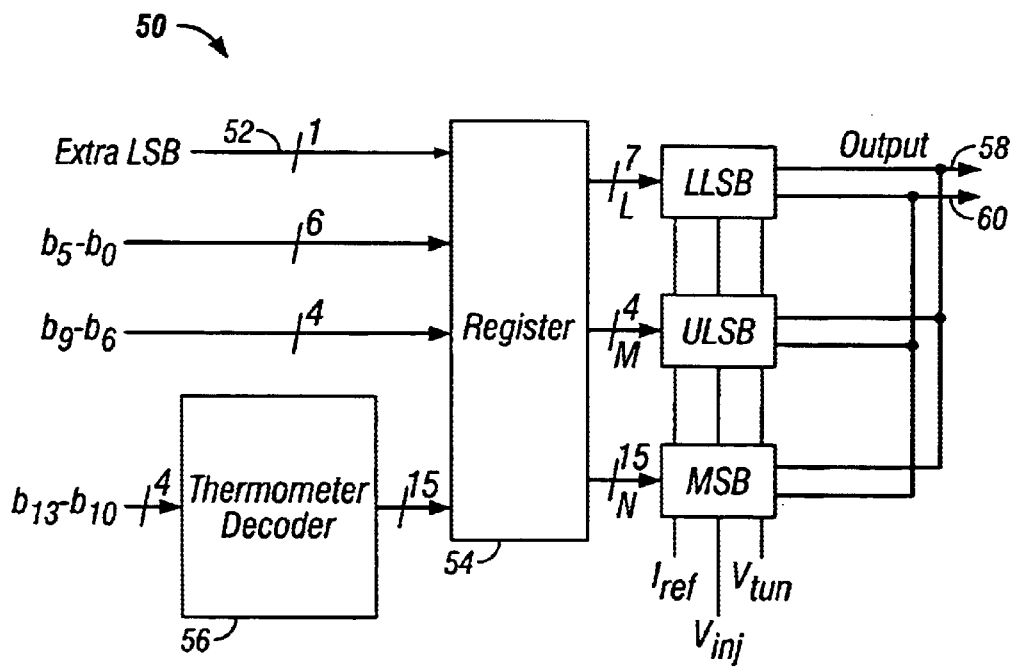
FIG. 3 is a system block diagram of a digital-to-analog converter (DAC) in accordance with one embodiment of the present invention.

FIG. 3 is a block diagram of a DAC 50 built in accordance with one embodiment of the present invention. In accordance with the embodiment of the DAC 50 shown in FIG. 3, a segmented current-source architecture with L (6) binary-decoded lower LSBs (least significant bits) (LLSB), M (4) binary-decoded upper LSBs (ULSB) and N (4) thermometer-decoded MSBs (most significant bits) is used. The on-chip calibration circuitry (not shown) trims the current sources in the ULSB and MSB segments, while intrinsic matching is solely relied upon for matching for the LLSB segment. Intrinsic matching could be avoided entirely here, but it is not necessary to do so, thus simplifying the circuit. The LLSB segment also includes an extra LSB current-source 52 (discussed below), used for calibration. The lower 10 input bits drive binary-weighted current-source arrays (6 LLSB and 4 ULSB), while the upper 4 bits are thermometer decoded with conventional thermometer decoder 56 to drive 15 identical current sources. The DAC 50 features a differential current output: each bit of the digital register controls a switch that steers the output from each current source in LLSB, ULSB and MSB to one of the two output terminals 58, 60. There is a global current reference ($I_{REF}$), and one global voltage ($V_{TUN}$) that control the injection and tunneling processes while the current sources are trimmed.

It should be noted that while a conventional static binary data register 54 is shown located on-chip in FIG. 3 to latch the 14-bit input codeword, there is no requirement for such a register and the bits could be received by the DAC in any other conventional manner without the use on an on-chip register.

As will now be apparent to those of ordinary skill in the art, the approach shown in FIG. 3 is designed to achieve 14-bit resolution (1 in 16384) without the need for intrinsically matched current sources. Thus only the LLSB current sources are intrinsically matched and do not require trimming. The ULSB current sources are digitally decoded (i.e., 1, 2, 4, 8, etc.) and the MSB current sources are thermometer decoded (i.e., 0000, 0001, 0011, 0111, etc.) and use smaller devices and simpler layouts to reduce die size.

Figure 4A:
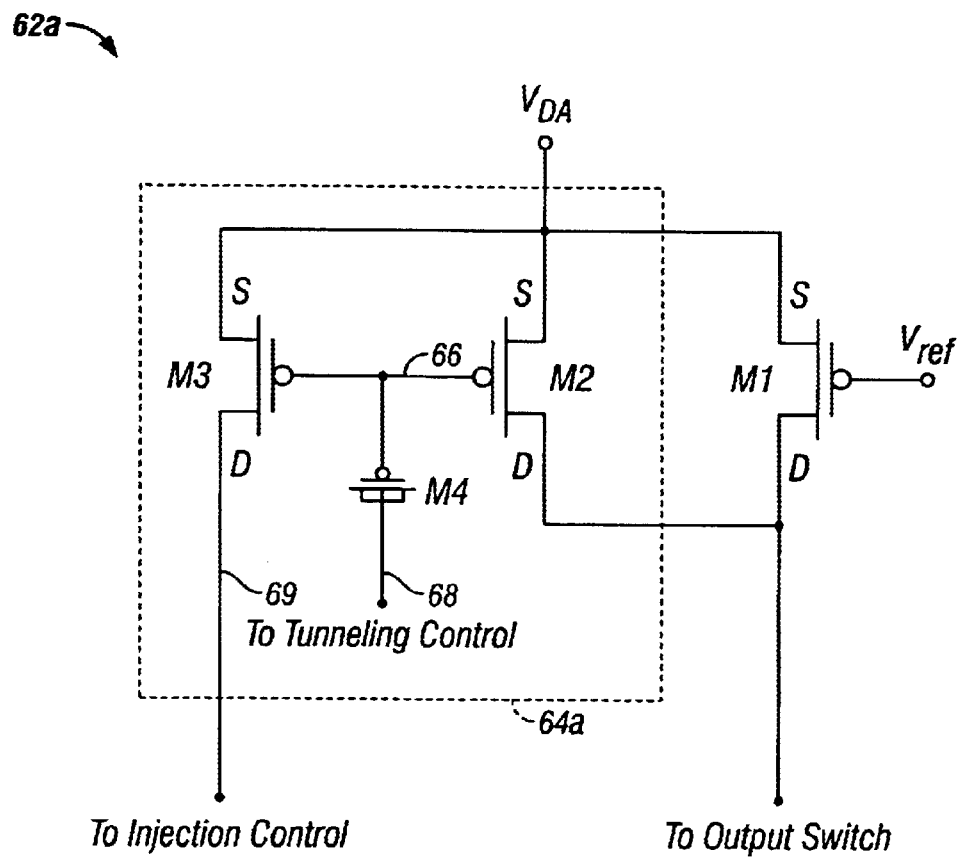
FIGS. 4A, 4B and 4C are electrical schematic diagrams of trimmable current sources in accordance with various embodiments of the present invention.

Turning now to FIG. 4A, an example of a trimmable current source 62a is shown. Each current source (M1) has an associated trim device 64a including a floating-gate pFET (M2) having a floating gate 66, an injection device (M3) tied to floating gate 66, and a tunneling junction (M4) tied to floating gate 66. Transistor M2 adds a trim current to the current supplied by current source transistor M1. The amount of the trim current depends on the floating-gate voltage, which, in turn, depends on the amount of charge on the floating gate. This charge is decreased by connecting the drain of injection device M3 to the global injection voltage $V_{INJ}$, thereby causing hot-electron injection on the floating gate shared by floating-gate pFET M2 and injection device M3. Charge is increased by raising the tunneling junction voltage up to the global tunneling voltage $V_{TUN}$, thereby tunneling electrons off of the floating gate using a Fowler-Nordheim process. The floating gate, therefore, acts as a memory for transistor M2. The tunneling junctions in all trimmable current sources are connected to a global tunneling line 68. The supply voltage, $V_{DA}$, is, in one embodiment, +3.3V.

Figure 4B:
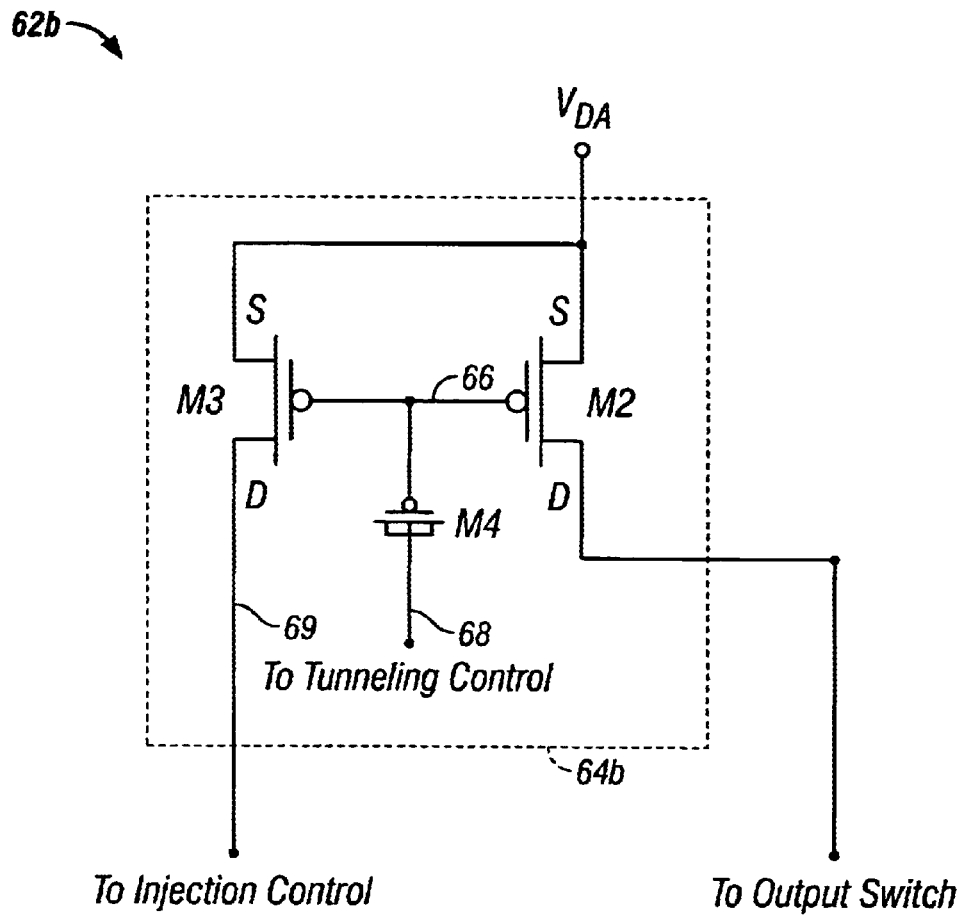

FIG. 4B illustrates a modification of the FIG. 4A embodiment. In this version trimmable current source 62b is modified from trimmable current source 62a of FIG. 4A by omitting current-source transistor M1. Thus, all current in this version is sourced by the trim device 64b.

Figure 4C:
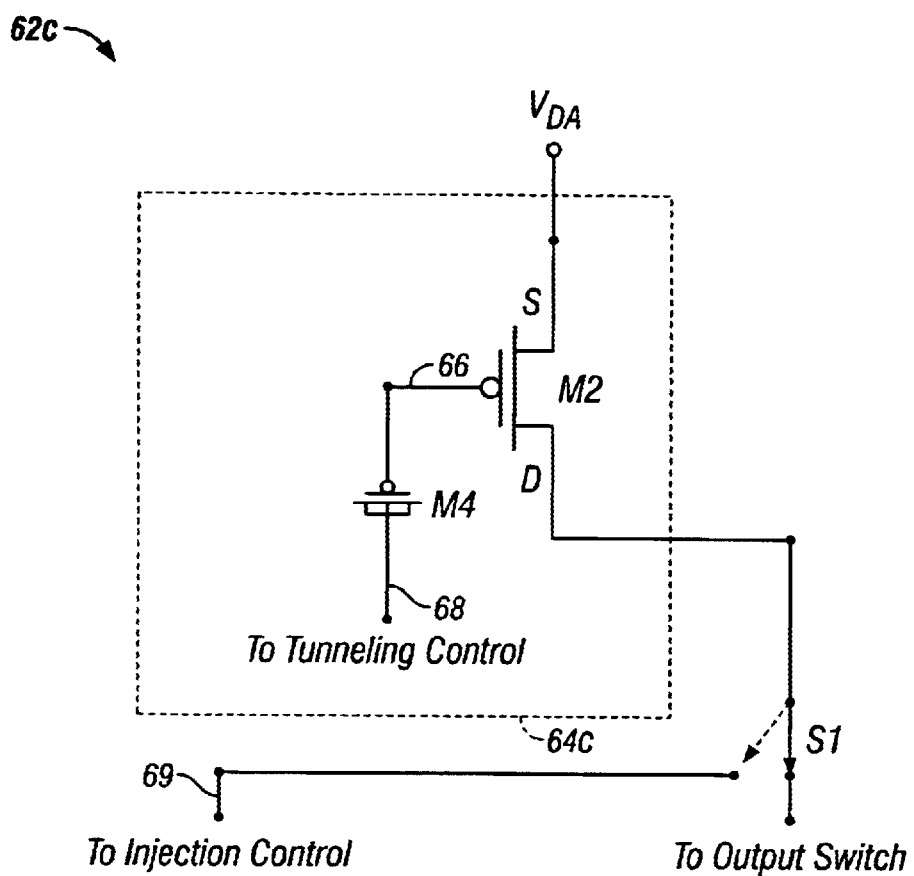

FIG. 4C illustrates yet another modification of the FIG. 4A and FIG. 4B embodiments. In this version trimmable current source 62c is modified from trimmable current source 62b of FIG. 4B by further omitting injection transistor M3 from trim device 64c. To make the circuit work, switch S1 (which may be a MOSFET) is added to allow the drain of trimmable current source transistor M2 to be connected to the injection control line 69 during injection and to the output switch line at other times.

Nineteen pFETs allow for the increase in the current of the 4 ULSB and 15 thermometer-decoded MSB current sources. A pFET's current is unipolar, so the trim transistors by themselves do not provide bi-directional trimming. Floating-gate pFET-based current-regulation circuits (not shown) may be added to trim down the current reference for each segment, thus allowing bi-directional trimming. Referring to FIG. 4A, to trim the output current down, transistor M1's voltage reference ($V_{REF}$) is raised. This results in a lower current contribution from transistor M1 in the total output current. A voltage regulation circuit controls $V_{REF}$. This circuit may be implemented using another floating-gate pFET similar to the trimming device 64a depicted in FIG. 4A.

The Trimming Procedure

To trim a DAC like that depicted in FIG. 3 having trimmable current sources like those depicted in FIGS. 4A, 4B and 4C, the following procedure (summarized in pseudo-code in FIG. 5) may be used:

First, at 70 erase all of the trim devices 64a/64b/64c by applying a high voltage $V_{TUN}$ (e.g., +7V) to the global tunneling line 68. The power supply for $V_{TUN}$ may be located either off-chip or on-chip and provided by conventional on-chip charge pumps.

Second, at 72 trim each bit individually using electron injection controlled over line 69, starting from the lowest ULSB:

To trim ULSB bit i, apply codeword $2^i-1$, add an extra LSB (i.e., the current from an extra LSB current source 52), and call the output current a "target current" and then apply codeword $2^i$ and trim bit i to cause the output current to match the target current.

To trim ULSB bit i+1, apply codeword $2^{i+1}-1$, add the extra LSB, and trim bit i+1 to match the new target current.

Trimming the thermometer-decoded current sources is achieved at 74 with essentially the same procedure described above but by incrementing the codeword in units of $2^{L+M}$ rather than by powers-of-two.

The procedure is continued until all trim pFETs have been calibrated.

Electron injection is induced by applying a negative voltage (e.g., −2.5V) to a trim device's injector pFET's drain (line 69). The power supply may be located either off-chip or on-chip and provided by conventional on-chip charge pumps.

Trimming is accomplished with one or more comparators which may. preferably be located on the same chip as the DAC along with a state machine for autonomous trimming. A "comparator" as used herein is a device which compares two inputs and produces a binary-valued result indicating which of the two inputs is larger. The inputs may be received simultaneously or successively in time.

Figure 6A:
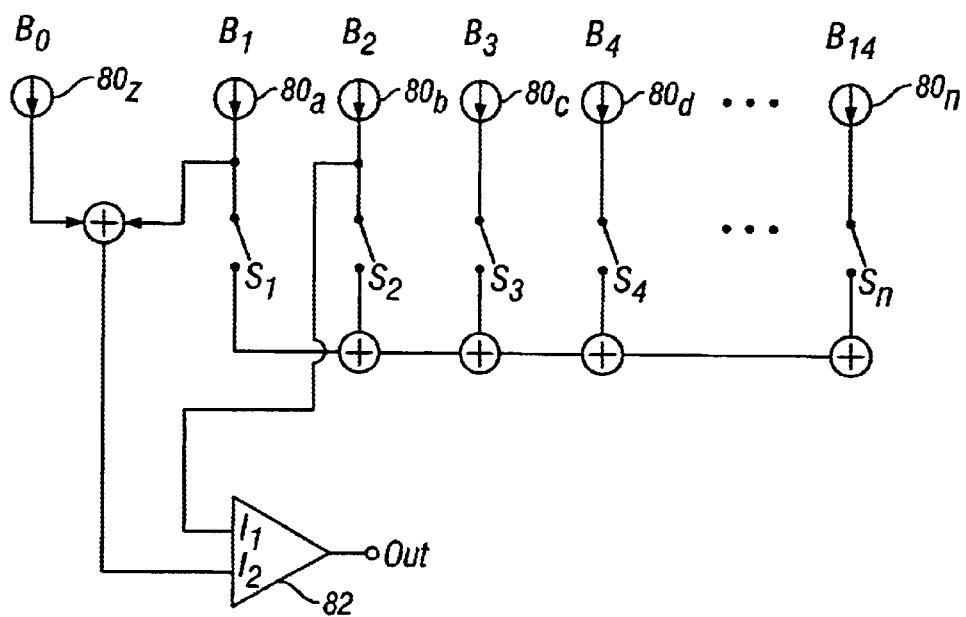
FIGS. 6A and 6B are electrical schematic diagrams of portions of comparator circuits for use with a DAC in accordance with various embodiments of the present invention.

There are a number of ways to implement a comparison circuit for use in calibrating ("trimming") the current-source elements. For example, FIG. 6A illustrates one approach. Each of the fourteen bits 1–14 has an associated current source 80a... 80n. Each current source 80a.., 80n is coupled to a switch, S (which may be a MOSFET, for example), which allows it to be switched into or out of a final current output line. An extra current source denoted 80z or Bit 0 is provided. The current from Bit 0 should be the same as that from Bit 1, that from Bit 2 should be twice that of Bit 1, that of Bit 3 should be twice that of Bit 2, and so on. Comparator 82 is coupled first to receive an input from Bit 0 and an input from Bit 1. The output of comparator 82 is used to control trimming circuitry to adjust the current source 80a so as to match its current output to that of current source 80z. (Alternatively, one could assume these to be approximately equal and forego this step). Bit 0 and Bit 1 are then coupled so that their respective currents are summed and this input is applied to one input of comparator 82 while Bit 2 (the current of which should equal 2*Bit 1, or Bit 1+Bit 0) is applied to the other input of comparator 82. The output of comparator 82 is then used, as above, to trim the current from Bit 2 so that it is substantially 2*Bit 1. The rest of the bits are trimmed in this manner. Not all of the circuitry necessary to fully implement this approach is shown in order to avoid over-complicating the disclosure. Since this approach is rather sensitive to trimming errors, it may be more desirable in some applications to simply provide a large number of identical current sources and drive them with a thermometer decoder, or a few identical current sources at each of several discreet current levels, or the approach shown in FIG. 3 which substantially reduces the total transistor count.

Figure 6B:
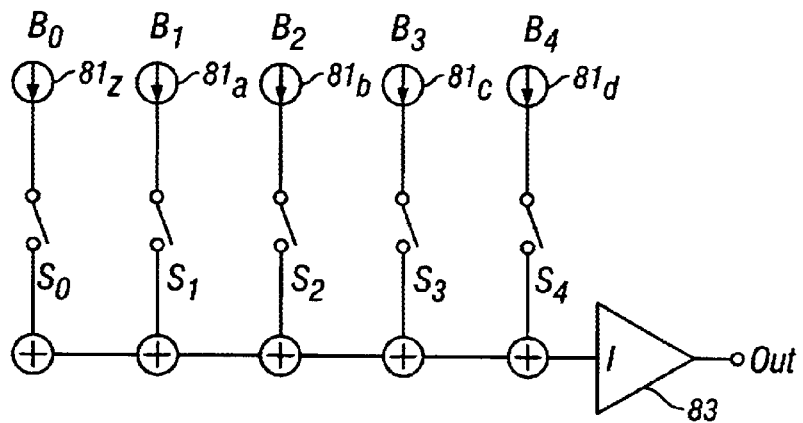

Alternatively, as illustrated in FIG. 6B, the comparator 83 is able to compare two consecutively received values and therefore has only one input coupled to the current output of the DAC. To trim Bit 1 to match its current to that of Bit 0, first input codeword 0000 (using thermometer decoding, a "1" connects the current source to the output and a "0" disconnects it) and turn on Bit 0. Comparator 83 senses the output and uses it as a reference. Then input codeword 0001 and turn off Bit 0. Comparator 83 now determines whether Bit 1 matched Bit 0. If not, Bit 1 is trimmed and the procedure is repeated until they match.

To trim Bit 2, first input codeword 0001 and turn on Bit 0. Then input codeword 0010 and turn off Bit 0. Comparator 83 determines whether the current from Bit 2 matches the current from Bit 1 plus that from Bit 0. If not, Bit 2 is trimmed and the procedure is repeated until they approximately match, and so on.

The use of a single comparator is advantageous because it saves on die area and reduces the complexity of the device.

In accordance with one embodiment of the present invention, a well-known technique called Correlated Double Sampling is used to compare the various currents so as to minimize noise and internal offsets in the comparator. It works as follows: the first step is to effectively "short" the comparator inputs together, perform a comparison, and remove any internal offsets within the comparator. Then, apply the input signals sequentially to the comparator for comparison. The first step effectively 'stores' the internal offsets in the comparator which are then applied to each input signal applied. The comparator subtracts the two signal inputs in the second step, subtracting the stored internal offsets of the comparator.

Figure 7A:
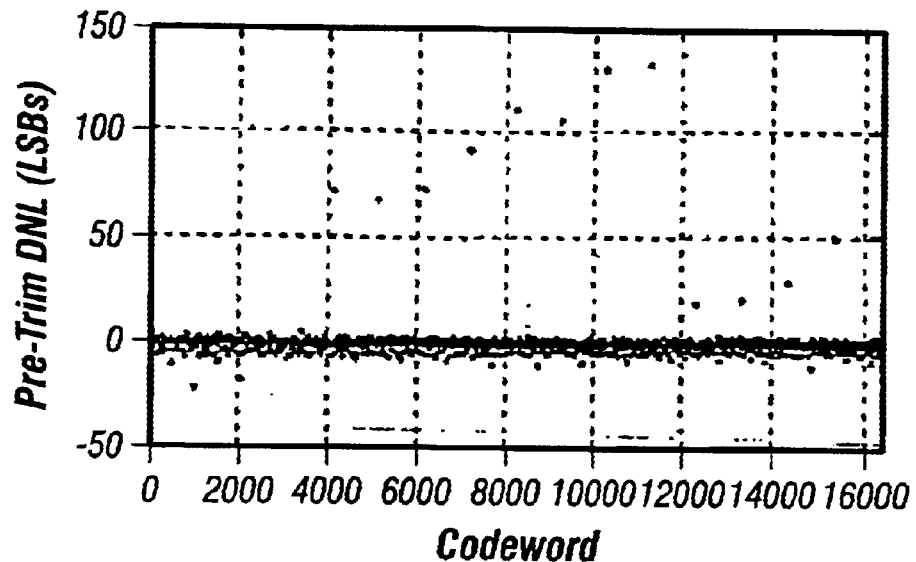
FIG. 7A is a plot of input codeword vs. pre-trim differential non-linearity (DNL) for a DAC in accordance with one embodiment of the present invention.
Figure 7B:
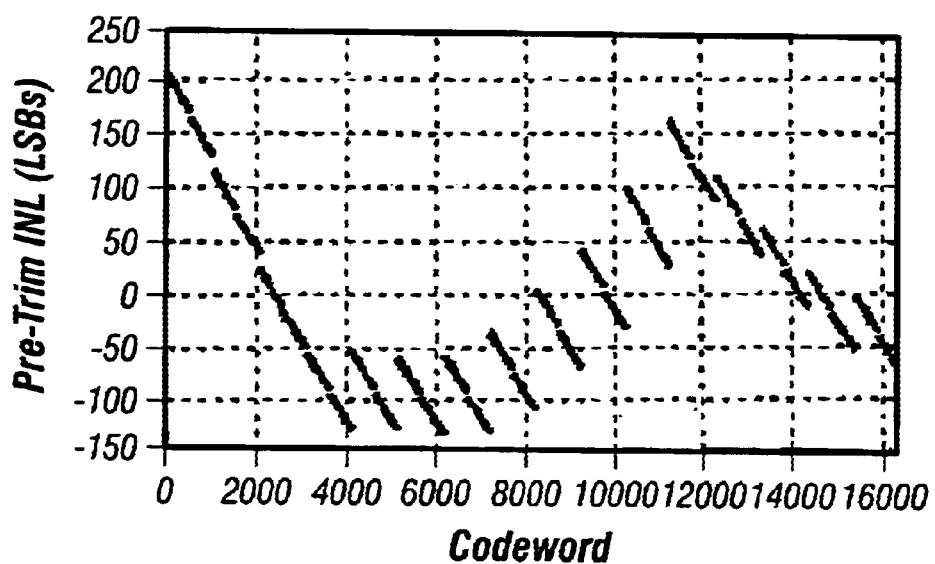
FIG. 7B is a plot of input codeword vs. pre-trim integral non-linearity (INL) for a DAC in accordance with one embodiment of the present invention.
Figure 7C:
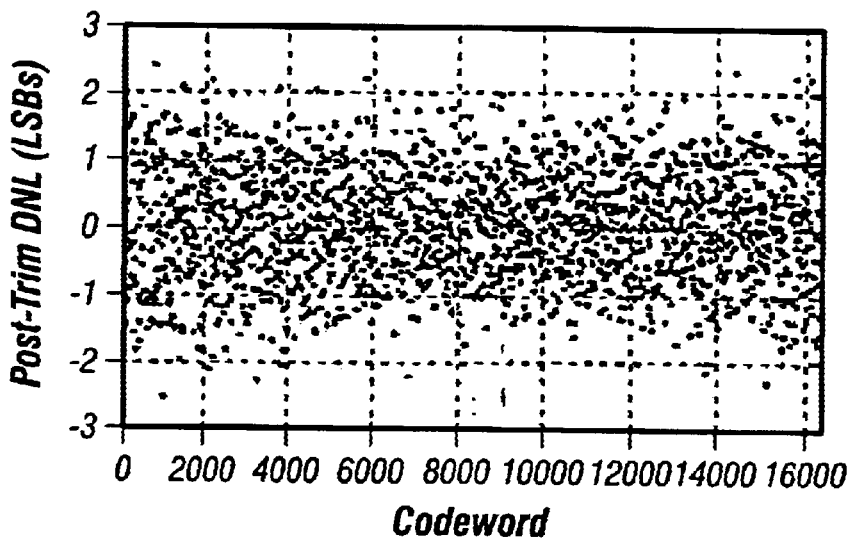
FIG. 7C is a plot of input codeword vs. post-trim differential non-linearity (DNL) for a DAC in accordance with one embodiment of the present invention.
Figure 7D:
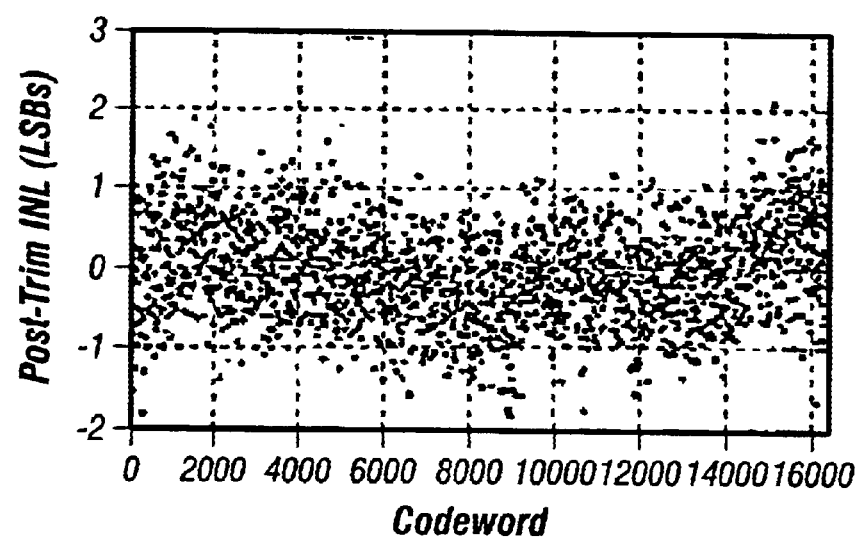
FIG. 7D is a plot of input codeword vs. post-trim integral non-linearity (INL) for a DAC in accordance with one embodiment of the present invention.

Turning now to FIGS. 7A, 7B, 7C and 7D, FIG. 7A is a plot of the pre-trim differential non-linearity (DNL) of a DAC in accordance with one embodiment of the present invention which exceeds 140 LSBs. FIG. 7B is a plot of the pre-trim integral non-linearity (INL) of a DAC in accordance with one embodiment of the present invention which exceeds 200 LSBs. FIG. 7C is a plot of the post-trim DNL of the DAC and FIG. 7D is a plot of the post trim INL of the DAC. The ULSBs and MSBs were trimmed to a DNL and INL of 0.5 LSBs. The points plotted between 0.5 and 2 LSBs were due to an untrimmable bit in the prototype.

In the prototype referred to above, the pFETs used 100 fF MOS capacitors for charge storage. While no significant charge decay has been detected in the actual prototypes of the device, it would be possible to force the DAC to periodically self-trim during idle states, power-up, or based upon a clock in order to avoid the possibility of operation after a significant charge decay. It is possible to pre-trim product prior to customer shipment and optionally avoid including calibration circuitry on the integrated circuit chip. It is also possible to build the calibration circuitry onto the integrated circuit chip and allow self-calibration and/or periodic calibration including calibration initiated at power-up and the like.

In accordance with one embodiment of the present invention, implemented using a 0.25 micron digital CMOS process, the total active area of the DAC is 0.17 mm$^2$; the calibration circuitry occupies less than 10% of that area. The total power dissipation for a −10 dBm output is 11 mW at 100 MHz with a 3.3V power supply. The output power can, of course, be scaled up to any level required by the application as those of ordinary skill in the art will now appreciate.

Accordingly, a CMOS DAC that uses floating-gate pFETs for electrical trimming has been shown and described. Because the current-source transistors themselves are trimmed, the power and area used are significantly less than existing high-linearity DACs. Furthermore, these DACs can be fabricated in any standard CMOS process which can also build low-leakage floating-gate pFETs. Nonvolatile DAC calibration using floating-gate pFETs has several advantages over other calibration approaches. First, the mechanism works on standard digital CMOS processes, and does not require expensive steps like laser trimming. Second, calibration can be performed in-house prior to product shipment, or on-chip circuitry can be provided to permit calibration in use. The extra circuitry needed only comprises charge pumps to generate tunneling and injection voltages, and a state machine to execute the calibration process. Third, this approach does not require sophisticated layout techniques to improve intrinsic matching up to a large number of bits, resulting in more compact layouts, smaller die area and higher yield. Additionally, unlike continuous calibration approaches, this technique does not impact the dynamic performance of the DAC because it does not need to replace current sources on the fly. Moreover, continuous calibration is mostly practical only in thermometer-decoded segments because all current sources are identical, and a single replacement current source can be used. This approach can be applied to binary-decoded current-source arrays as well as to thermometer decoded segments. It is also possible to apply nonvolatile calibration on a periodic basis, to track temperature variations and other environmental changes.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims.

What is claimed is:

1. A digital-to-analog converter (DAC), comprising:
   a digital input;
   a current-source element responsive to the digital input sourcing a current having a total current magnitude; and
   a memory associated with the current-source element, wherein the total current magnitude sourced by said current source element is continuously variable in response to said memory.

2. The DAC in accordance with claim 1, wherein said total current magnitude comprises a first current magnitude and a second current-magnitude, said first current magnitude being sourced by a first transistor and said second current magnitude being sourced by a second transistor.

3. The DAC in accordance with claim 1, wherein said memory is a nonvolatile memory.

4. The DAC in accordance with claim 3, wherein said nonvolatile memory includes a floating gate for storing charge.

5. The DAC in accordance with claim 4, wherein said floating gate stores an analog charge value.

6. The DAC in accordance with claim 5, wherein said nonvolatile memory is the floating gate of a synapse transistor.

7. The DAC in accordance with claim 6, wherein said synapse transistor is a p-channel MOSFET.

8. The DAC in accordance with claim 6, wherein said synapse transistor includes a control-gate electrode.

9. The DAC in accordance with claim 6, wherein said synapse transistor does not have a control-gate electrode.

10. A digital-to-analog converter (DAC), comprising:
    a digital input;
    a current-source element responsive to the digital input sourcing a current having a total current magnitude; and
    a memory associated with the current-source element, wherein the total current magnitude sourced by said current source element is responsive to said memory, wherein said total current magnitude comprises a first current magnitude and a second current magnitude, said first current magnitude being sourced by a first transistor and said second current magnitude being sourced by a second transistor, and wherein said second current magnitude is responsive to said memory and said first current magnitude is not.

11. The DAC in accordance with claim 10, wherein said first transistor includes a voltage input for controlling said first current magnitude.

12. A digital-to-analog converter (DAC), comprising:
    a codeword register receiving a digital codeword for conversion to an analog current signal;
    a current-source responsive to a state of the codeword register;
    a trim device coupled to the current-source, wherein the current-source and the trim device provide a combined current output, said trim device including a memory storing a trim weight used by the trim device to adjust said combined current output.

13. The DAC in accordance with claim 12, wherein said memory is a nonvolatile memory.

14. The DAC in accordance with claim 13, wherein said nonvolatile memory includes a floating gate for storing charge.

15. The DAC in accordance with claim 14, wherein said floating gate stores an analog charge value.

16. The DAC in accordance with claim 15 wherein said nonvolatile memory is the floating gate of a synapse transistor.

17. The DAC in accordance with claim 16 wherein said synapse transistor is a p-channel MOSFET.

18. The DAC in accordance with claim 16 wherein said synapse transistor includes a control-gate electrode.

19. The DAC in accordance with claim 16 wherein said synapse transistor does not have a control-gate electrode.

20. A trimmable current-source element for a current-steering-type digital-to-analog converter (DAC), said element comprising:
    a first current-source transistor having a source and a drain and sourcing a first magnitude of current to an output node; and
    a nonvolatile memory coupled to said first current-source transistor, said first magnitude of current responsive to variations in the amount of charge stored on a floating gate of said nonvolatile memory.

21. The trimmable current-source element in accordance with claim 20, wherein said floating gate of said nonvolatile memory comprises a gate of said first current-source transistor.

22. The trimmable current-source element in accordance with claim 20, further comprising:
    a second current-source transistor having a source and a drain and sourcing a second magnitude of current to said output node, said output node providing a current comprising a sum of said first magnitude of current and said second magnitude of current.

23. The trimmable current-source element in accordance with claim 22, further comprising a reference voltage input to said second current-source transistor, said reference voltage input controlling said second magnitude of current.

24. The trimmable current-source transistor in accordance with claim 20, further comprising:
    a tunneling device coupled to remove electrons from said floating gate in response to application of a tunneling control voltage to said tunneling device.

25. The trimmable current-source element in accordance with claim 24, further comprising:
    an injector coupled to inject electrons onto said floating gate in response to application of an injection control voltage to said injector.

26. The trimmable current-source element in accordance with claim 25, further comprising:
   a second current-source transistor having a source and a drain and sourcing a second magnitude of current to said output node, said output node providing a current comprising a sum of said first magnitude of current and said second magnitude of current.

27. The trimmable current-source element in accordance with claim 26, further comprising a reference voltage input to said second current-source transistor, said reference voltage input controlling said second magnitude of current.

28. The trimmable current source element in accordance with claim 27, wherein said first current-source transistor.is a synapse transistor.

29. The trimmable current-source element in accordance with claim 28, wherein said synapse transistor is a p-channel MOSFET.

30. A digital-to-analog converter (DAC), comprising
   means for buffering a digital codeword for conversion to an analog current signal;
   means for generating an output current at an output node responsive to a state of said buffering means;
   means for trimming said output current, said trimming means including non-volatile memory means for controlling a current output of said trimming means.

31. The DAC in accordance with claim 30, wherein said nonvolatile memory means includes a floating gate for storing a charge.

32. The DAC in accordance with claim 31, further comprising means for erasing said floating gate.

33. The DAC in accordance with claim 32, wherein said erasing means includes a means for tunneling electrons off of said floating gate.

34. A method for trimming a current-steering-type digital-to-analog converter (DAC), the DAC including an input codeword register and a plurality of trimmable current-source elements each having:
   a current source transistor having a source and drain;
   a trim device having a floating gate, a source and a drain, said source and drain of said trim device coupled in parallel with said source and drain of said current-source transistor;
   an injection device coupled to inject electrons onto said floating gate in response to application of an injection control voltage to said injection device;
   a tunneling device coupled to remove electrons from said floating gate in response to application of a tunneling control voltage to said tunneling device; and
   an output node coupled to said drain of said current source transistor and said drain of said trim device; said method comprising the steps of:
      erasing the floating gates of all trim devices by applying a relatively high tunneling control voltage to said tunneling devices; and
      trimming each current-source element using electron injection by applying a negative voltage to each trim device's drain.

35. The method in accordance with claim 34, wherein said trimming includes:
   comparing (1) a first total current generated by the DAC in response to a first codeword applied to the codeword register of the DAC added to the current from an additional LSB current-source with (2) a second total current generated by the DAC in response to a second-codeword applied to the codeword register of the DAC, and trimming a current-source used to generate the second total current so that the second total current is substantially equal to the first total current.

36. The method in accordance with claim 35, wherein said comparing is performed sequentially for a plurality of the current-source elements with a single comparator.

* * * * *

UNITED STATES PATENT AND TRADEMARK OFFICE
CERTIFICATE OF CORRECTION

PATENT NO. : 6,664,909 B1
DATED : December 16, 2003
INVENTOR(S) : John D. Hyde et al.

It is certified that error appears in the above-identified patent and that said Letters Patent is hereby corrected as shown below:

Column 1,
Line 65, replace "nichirome" with -- nichrome --.

Column 3,
Line 30, replace "illustratedin" with -- illustrated in --.
Line 51, replace "memory.reading" with -- memory reading --.

Column 6,
Line 40, replace "not.shown" with -- not shown --.
Line 63, replace "i" with -- $i$ --.

Column 7,
Lines 1 and 2, replace "i + 1" with -- $i + 1$ --.
Line 15, replace "may.preferably" with -- may preferably --.

Column 9,
Line 34, replace "current-magnitude" with -- current magnitude --.

Column 11,
Line 13, replace "transistor.is" with -- transistor is --.

Signed and Sealed this

Thirty-first Day of August, 2004

JON W. DUDAS
*Director of the United States Patent and Trademark Office*